United States Patent
Sato

(10) Patent No.: US 8,524,550 B2
(45) Date of Patent: Sep. 3, 2013

(54) METHOD OF MANUFACTURING SEMICONDUCTOR DEVICE AND SEMICONDUCTOR DEVICE

(75) Inventor: Ken Sato, Saitama (JP)

(73) Assignee: Sanken Electric Co., Ltd., Saitama-Ken (JP)

( * ) Notice: Subject to any disclaimer, the term of this patent is extended or adjusted under 35 U.S.C. 154(b) by 91 days.

(21) Appl. No.: 13/308,360

(22) Filed: Nov. 30, 2011

(65) Prior Publication Data

US 2012/0132962 A1    May 31, 2012

(30) Foreign Application Priority Data

Nov. 30, 2010    (JP) ................. 2010-266573

(51) Int. Cl.
    *H01L 21/338*    (2006.01)
(52) U.S. Cl.
    USPC .................. 438/172; 257/E21.407
(58) Field of Classification Search
    USPC .......... 438/167, 172; 257/E21.403, E21.407, 257/E29.246
    See application file for complete search history.

(56) References Cited

U.S. PATENT DOCUMENTS

| 7,728,356 | B2 * | 6/2010 | Suh et al. ............. | 257/194 |
| 2003/0207518 | A1 * | 11/2003 | Kong et al. ........... | 438/200 |
| 2009/0085065 | A1 * | 4/2009 | Mishra et al. ......... | 257/194 |
| 2012/0061729 | A1 * | 3/2012 | Shibata et al. ........ | 257/194 |

FOREIGN PATENT DOCUMENTS

JP    2004-200711    7/2004

* cited by examiner

*Primary Examiner* — Lex Malsawma
(74) *Attorney, Agent, or Firm* — Wilmer Cutler Pickering Hale and Dorr LLP

(57) ABSTRACT

A method of manufacturing a semiconductor device, in which a second semiconductor layer of $Al_xGa_{1-x-y}In_yN$ (wherein x, y, and x+y satisfy x>0, y≧0, and x+y≦1, respectively) on a first semiconductor layer of GaN by hetero-epitaxial growth using a MOCVD method, the method including the steps of: (a) supplying N source gas and Ga source gas to form the first semiconductor layer; (b) supplying the N source gas without supplying the Ga source gas and Al source gas, after step (a); (c) supplying the N source gas and the Al source gas without supplying the Ga source gas, after step (b); and (d) supplying the N source gas, the Ga source gas and the Al source gas to form the second semiconductor layer, after step (c).

6 Claims, 3 Drawing Sheets

Figure 3:
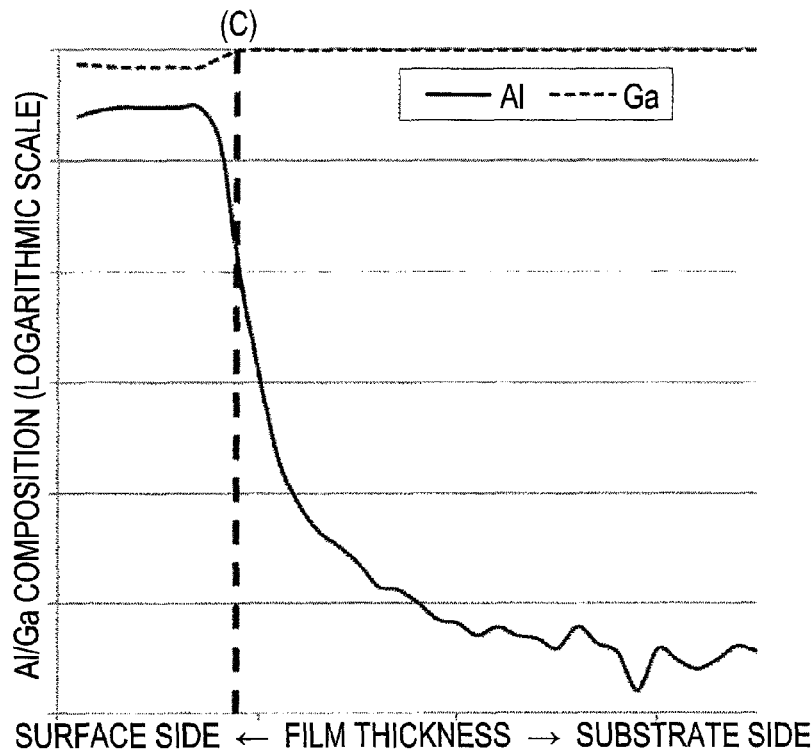

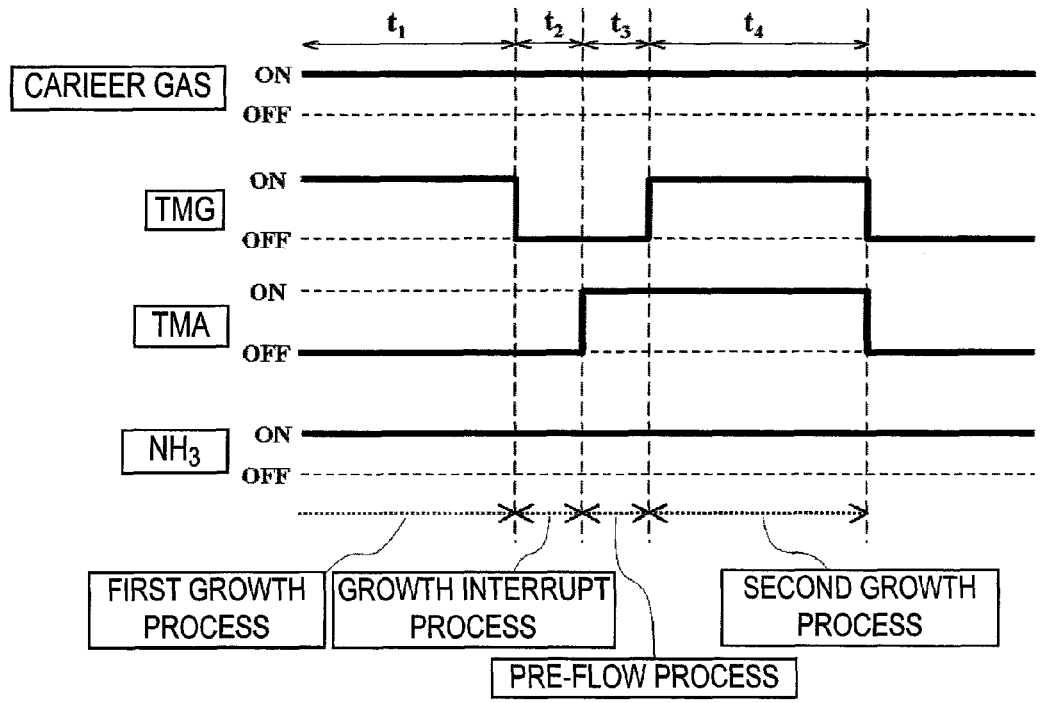
FIG.1
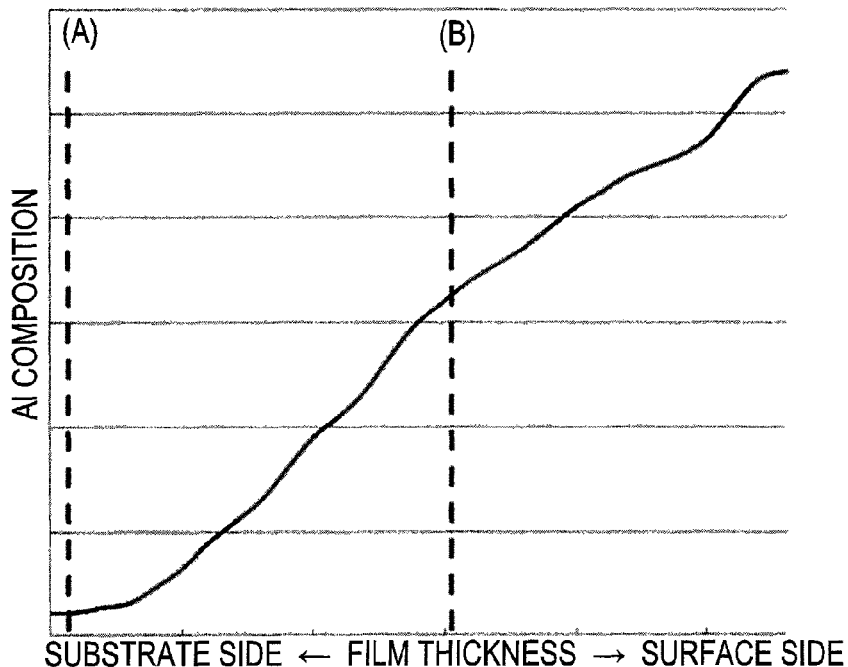
FIG.2 - BACKGROUND ART -

FIG.5
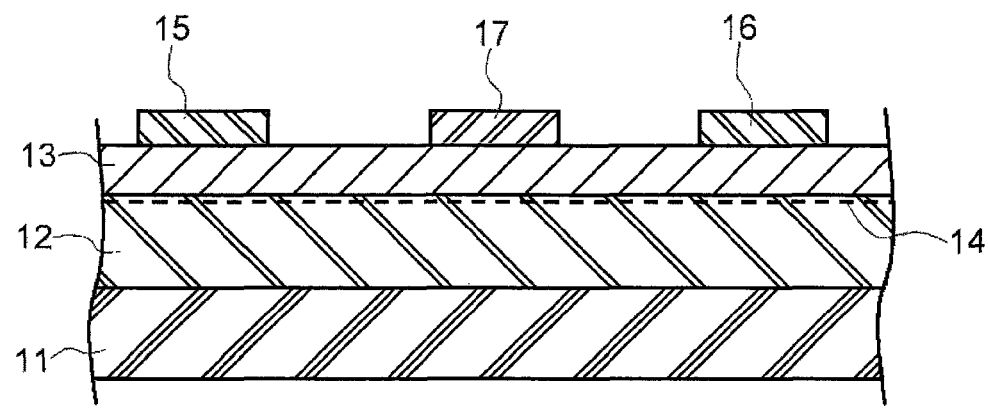
FIG.6       - BACKGROUND ART -
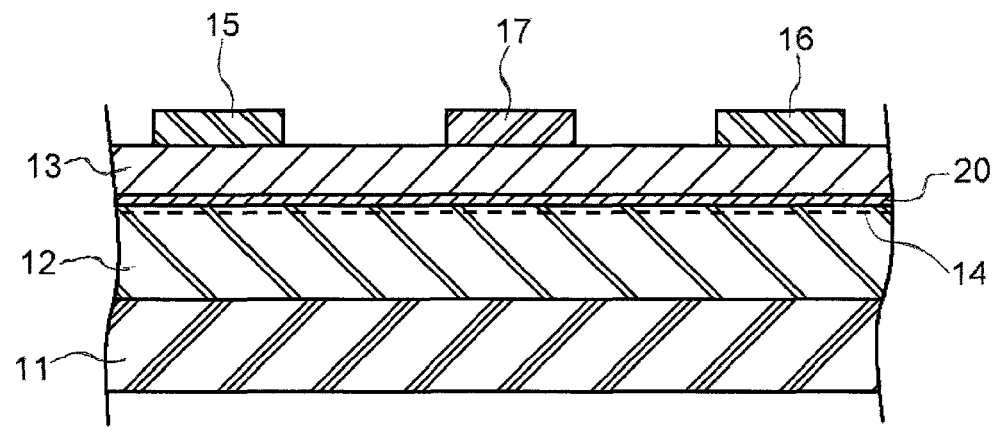

METHOD OF MANUFACTURING SEMICONDUCTOR DEVICE AND SEMICONDUCTOR DEVICE

CROSS-REFERENCE TO RELATED APPLICATION

This application claims priority from Japanese Patent Application No. 2010-266573 filed on Nov. 30, 2010, the entire subject matter of which is incorporated herein by reference.

TECHNICAL FIELD

This disclosure relates to a method of manufacturing a semiconductor device using an abrupt heterojunction interface of a compound semiconductor. Further, this disclosure also relates to the semiconductor device.

BACKGROUND

A high electron mobility transistors (HEMT) using, for example, GaN has been used as semiconductor devices using compound semiconductors, specifically as high-power/high-frequency elements. FIG. 5 illustrates an outline of a cross-sectional structure of a HEMT device (semiconductor device) 10 using a nitride semiconductor. In FIG. 5, on a substrate 11, an electron transit layer 12 and a barrier layer 13 are sequentially formed by epitaxial growth. Herein, for example, the electron transit layer 12 is made of semi-insulating (undoped) GaN, and the barrier layer 13 is made of semi-insulating (undoped) AlGaN (precisely semi-insulating (undoped) $Al_xGa_{1-x}N$, where x is about 0.20). In this structure, on a side of the electron transit layer 12 in the vicinity of an interface (hetero interface) of the electron transit layer 12 and the barrier layer 13, a two-dimensional electron gas layer 14 (shown by a broken line in FIG. 5) that is to be an electrically conductive layer is formed in parallel with the hetero interface by a piezoelectric effect. According to the two-dimensional electron gas layer 14, a current flow between a source electrode 15 and a drain electrode 16, and a channel configured by the two-dimensional electron gas is switched on or off according to a voltage applied to a gate electrode 17 that is to be a Schottky electrode. At this time, since the speed (mobility) of electrons in the two-dimensional electron gas is very high, a high-speed operation is possible. Further, since GaN has a band gap wider than of that of GaAs or the like, the HEMT device 10 has a high pressure resistance and thus is capable of a high-power operation.

In the HEMT device 10, in order to increase the mobility in the two-dimensional electron gas layer 14 and obtain high conductance, it is required that the interface (hetero interface) of the electron transit layer 12 and the barrier layer 13 is abrupt, that is, a composition variation between the electron transit layer 12 and the barrier layer 13 is abrupt at the interface. The electron transit layer 12 and the barrier layer 13 are consecutively formed by, for example, a metal organic chemical vapor deposition (MOCVD) method, a molecular beam epitaxy (MBE), or the like.

In order to obtain a HEMT device having high mobility, for example, JP-A-2004-200711 discloses a technology of inserting a spacer layer, which has high aluminum composition and a wide band gap, in the vicinity of a hetero interface. FIG. 6 is a cross-sectional view illustrating a cross-sectional structure of a HEMT device (semiconductor device) 30 disclosed in JP-A-2004-200711. Here, between an electron transit layer (GaN layer) 12 and a barrier layer (AlGaN layer) 13, an AlN spacer layer 20 is as thin as one to four molecular layers (about 0.25 nm to 1 nm) is inserted. It is possible to widen the band gap at a position of the spacer layer 20 and to improve abruptness in a band structure, thereby substantially improving abruptness at the hetero interface. According to this technology, it is possible to increase the mobility at the two-dimensional electron gas layer 14 and to obtain a HEMT device having high conductance.

SUMMARY

However, even in the case of using the structure disclosed in JP-A-2004-200711, it is difficult in a heterojunction of a nitride semiconductor to obtain actually an ideally abrupt hetero interface in an electron transit layer, a spacer layer, and a barrier layer by using the MOCVD method. For this reason, it is difficult to obtain a high-performance HEMT device using a nitride semiconductor.

According to this disclosure, a semiconductor device, which has an abrupt hetero interface formed therein, made of a nitride semiconductor having high mobility is provided.

A method of manufacturing a semiconductor device in one aspect of this disclosure, in which a second semiconductor layer of $Al_xGa_{1-x-y}In_yN$ (wherein x, y, and x+y satisfy $x>0$, $y\geqq 0$, and $x+y\leqq 1$, respectively) on a first semiconductor layer of GaN by hetero-epitaxial growth using a MOCVD method, the method comprising the steps of: (a) supplying N source gas and Ga source gas to form the first semiconductor layer; (b) supplying the N source gas without supplying the Ga source gas and Al source gas, after step (a); (c) supplying the N source gas and the Al source gas without supplying the Ga source gas, after step (b); and (d) supplying the N source gas, the Ga source gas and the Al source gas to form the second semiconductor layer, after step (c).

Since this disclosure is configured as described above, it is possible to provide a semiconductor device, which has an abrupt hetero interface formed therein, made of a nitride semiconductor having high mobility.

BRIEF DESCRIPTION OF THE DRAWINGS

The foregoing and additional features and characteristics of this disclosure will become more apparent from the following detailed descriptions considered with the reference to the accompanying drawings, wherein:

FIG. 1 is a view illustrating a source-gas supplying situation in each process of a method of manufacturing a semiconductor device according to an exemplary embodiment of this disclosure;

FIG. 2 illustrates a result of measurement of a composition distribution in the vicinity of an interface when forming an MN spacer layer directly on a GaN layer according to the background art;

FIG. 3 illustrates a result of measurement of a composition distribution in the vicinity of an interface when forming an AlGa layer on a GaN layer by using the method of manufacturing the semiconductor device according to the exemplary embodiment of this disclosure;

FIG. 4 is a view illustrating a source-gas supply situation in each process of a modification of the method of manufacturing a semiconductor device according to the exemplary embodiment of this disclosure;

FIG. 5 is a cross-sectional view of one example of HEMT device; and

FIG. 6 is a cross-sectional view of another example of the HEMT device according to the background art.

DETAILED DESCRIPTION

Hereinafter, a method of manufacturing a semiconductor device according to an exemplary embodiment of this disclosure will be described. The semiconductor device manufactured herein is a high electron mobility transistor (HEMT) element using a nitride semiconductor. In this HEMT device, a first semiconductor layer (electron transit layer: GaN) and a second semiconductor layer (barrier layer: AlGaN) are sequentially formed on a substrate. A current flow in a direction along a hetero interface between the first semiconductor layer and the second semiconductor layer, that is, in a direction parallel with the substrate plane, and the HEMT device is operated.

A cross-sectional structure of the semiconductor device, which is manufactured by this method, is similarly to FIG. 5. In other words, the semiconductor device 10 includes an electron transit layer (first semiconductor layer) 12 and a barrier layer (second semiconductor layer) 13 sequentially formed on a substrate 11. But, the semiconductor device 10 does not include a spacer layer 20 as shown in FIG. 6. The substrate 11 is monocrystal of silicon (Si) or silicon carbide (SiC), for example. The electron transit layer 12 is made of semi-insulating (undoped) GaN, and the barrier layer 13 is made of semiconductor (undoped) AlGaN (precisely, semi-insulating (undoped) $Al_xGa_{1-x}N$, where $x \leq 0.5$). The method of manufacturing a semiconductor device described herein specifically relates to a growth method from the electron transit layer 12 to the barrier layer 13. This growth method is based on the MOCVD method.

In the MOCVD method, source gases are used for growing GaN and/or AlGaN. Trimethylgallium (TMG) is used as Ga source, ammonia ($NH_3$) is used as a nitrogen (N) source, and trimethylaluminum (TMA) is used as an Al source. Further, as carrier gas for carrying those source gases, hydrogen ($H_2$) or the like is used. A substrate temperature during the growth is about 1100° C. As a plane orientation of the substrate 11, in a case of Si, a (111) Miller plane is preferably used. In a case of SiC, a (0001) Miller plane is preferably used. In this case, the above-mentioned gases are flowed on the substrate 11, thereby growing a c-plane of GaN or AlGaN having a wurtzite crystal structure on the substrate 11. In this structure, both of the electron transit layer 12 and the barrier layer 13 are undoped, so that gas for doping is not used. Incidentally, as will be described below, it is possible to make the barrier layer (second semiconductor layer) 13 of $Al_xGa_{1-x-y}In_yN$ (where $x>0$, $y \geq 0$, and $x+y<1$). In this case, indium (In) will be added and indium (In) source gas will be also used.

FIG. 1 is a view schematically illustrating a situation of supply (ON) and supply disruption (OFF) of the above-mentioned gases from the growth of the electron transit layer 12 (GaN) to the growth of the barrier layer 13 (AlGaN), changing with time in the growth method. The processes are broadly divided into a first growth process, a growth interrupt process, a pre-flow process, and a second growth process. Actually, a flow rate of each gas is appropriately controlled; however, the flow rate of each gas is simplified. Additionally, the carrier gas and the nitrogen source gas ($NH_3$) are supplied (ON) over all processes.

First, in the first growth process, in order to grow the electron transit layer 12 (GaN layer), $NH_3$ and TMG are supplied (ON) to a chamber of a MOCVD apparatus, and TMA is not supplied (OFF). In the first growth process, the flow rate of TMG is set to a first flow rate $f_1$, and a time period $t_1$ of the first growth process is appropriately set according to the thickness of the electron transit layer 12 (GaN layer).

Next, prior to the growth of the barrier layer 13, the growth interrupt process, in which both of TMG and TMA are not supplied, is performed during a time period $t_2$. This time period $t_2$ is set as a certain amount of time so that Ga source gas remains in the chamber. For example, the time period $t_2$ is set to 5 minutes or less, more preferably 1 minute or less, for the following reason. Incidentally, the time period $t_2$ may be set to, for example about 20 seconds, according to the process conditions such as the flow rate of the carrier gas ($H_2$) or the nitrogen source gas ($NH_3$).

Next, the pre-flow process, in which TMA is supplied (ON) and but TMG is not supplied (OFF), is performed. In the pre-flow process, the flow rate of TMA is set to a second flow rate $f_2$. The second flow rate $f_2$ is set so that an abrupt interface is formed between the electron transit layer 12 and the barrier layer 13. A time period $t_3$ of the pre-flow process is shorter than a period when the AlGaN layer is formed so as to be as thin as two molecular layers (one molecular layer has a thickness of about 0.25 nm).

Next, the second growth process, in which TMG and TMA are supplied, for growing the barrier layer 13 (AlGaN layer) is performed. In the second growth process, the flow rate of TMG is set to a third flow rate $f_3$ lower than the first flow rate $f_1$, and the flow rate of TMA is set to a fourth flow rate $f_4$. The third flow rate $f_3$ and the fourth flow rate $f_4$ are appropriately set so that the barrier layer 13 having a desired composition is to be formed. For example, ($f_3$ is smaller than $f_1$) and ($f_4$ is subequal to $f_2$) can be satisfied. A time period $t_4$ of the second growth process is appropriately set according to the thickness of the grown barrier layer 13 (AlGaN). After that, the supply of TMA and TMG is shut off, thereby finishing the growth.

In the above processes, since the growth interrupt process and the pre-flow process are provided, it is possible to improve the abruptness at the hetero interface between the electron transit layer 12 and the barrier layer 13. This reason will be described below.

FIG. 2 illustrates a result of an energy dispersive X-ray spectroscopy (EDX) measurement of a depth distribution of an Al composition in a section of a sample, in which an AlN layer (spacer layer 20) is directly grown on a GaN layer. FIG. 2 corresponds to a case of manufacturing the structure, which is disclosed in JP-A-2004-200711 and is shown in FIG. 6. In this case, immediately after the first growth process (electron-transit-layer growth process), TMA is supplied (ON) for a long time (TMG is not supplied (OFF) for a long time) to grow the AlN layer (spacer layer 20), without performing the growth interrupt process of FIG. 1. This time period is set to a time period in which the AlN layer is grown about 5 nm. In FIG. 2, the left side corresponds to a side of the electron transit layer 12 (a side of substrate 11), and the right side corresponds to a side of the barrier layer 13. In FIG. 2, a broken line (A) illustrates a designed interface between the electron transit layer 12 and the spacer layer 20, and a broken line (B) is a designed interface between the spacer layer 20 and the barrier layer 13. In other words, the supply of TMG is shut off and the supply of TMA starts at a time point when an area indicated by the broken line (A) of FIG. 2 is grown, and the supply of TMG restarts at a time point when an area indicated by the broken line (b) is grown.

From this result, it can be seen that even if the above-mentioned growth is performed on a condition so that AlN is grown on GaN, actually, the spacer layer 20 composed of AlN (having the Al composition of 100%) is not formed. Further, since the Al composition gently changes from the electron transit layer 12 to the barrier layer 13, it can also be seen that an abrupt junction is not obtained.

The cause is that, even if the growth of the spacer layer 20 (AlN layer) starts in a state in which TMG is not shut off, TMG used for the growth of the electron transit layer 12 (GaN layer) remains at a relatively high concentration in a growth atmosphere around the substrate disposed in the chamber. Further, in connection with this point, even when TMA is supplied, the effect is appeared with being delay. In other words, in a case where TMA is supplied for a short time, AlN is not grown. Actually, when TMA is supplied for a time period corresponding to the thickness of 5 nm, the AlN layer is not obtained.

Thus, in order to grow the barrier layer 13 (AlGaN layer) on the electron transit layer 12 (GaN layer) so that the composition changes abruptly, at least, it is preferable to reduce the concentration of TMG remaining in the chamber prior to the growth of AlGaN, and it is preferable to provide the effect of TMA earlier than in the time period of the growth of the AlGaN layer. Therefore, in the growth method of FIG. 1, since the growth interrupt process and the pre-flow process are applied, the abruptness is improved. It is preferable that a total flow rate of TMA in the pre-flow process is set so that the AlGaN layer is grown to be as thin as two molecular layers or less.

FIG. 3 illustrates a result of measurement of a composition distribution in the vicinity of an interface between the electron transit layer 12 and the barrier layer 13 obtained by the growth method of FIG. 1. FIG. 3 illustrates a secondary ion mass spectroscopy (SIMS) analysis result of a case of performing sputter etching from the grown surface. Unlike FIG. 2, the left side in FIG. 3 corresponds to the surface side (a side of barrier layer 13), a vertical axis represents a logarithmic scale, and a broken line (C) represents a designed interface between the electron transit layer 12 and the barrier layer 13. As a result of the growth method shown in FIG. 1, it can be seen that the composition of Al and Ga changes in the vicinity of the designed interface, and an abrupt interface is obtained between the electron transit layer 12 and the barrier layer 13. Further, although only TMA is supplied (ON) in the pre-flow process, the AlN layer (specifically, a layer having a high Al composition) is not formed at the interface. Thus, an ideally abrupt interface between the GaN layer and the AlGaN layer is obtained.

As described above, according to the above-mentioned manufacturing method, it is possible to improve the abruptness at the interface between the GaN layer and the AlGaN layer. Accordingly, it is possible to improve the mobility in the two-dimensional electron gas layer 14 and to improve the conductance, as described in the technology disclosed in JP-A-2004-200711.

Additionally, in a case of inserting the spacer layer 20 having a wide band gap as disclosed in JP-A-2004-200711, the ON resistance is reduced and but the leakage current increases. Further, in a case of an electrode structure of FIG. 6 (a structure in which the source electrode 15 and the drain electrode 16 are disposed on the surface), the spacer layer 20 having a wide band gap and high electrical resistance is inserted between the electrodes and the two-dimensional electron gas layer 14. Therefore, the contact resistance increases between the source electrode 15 or the drain electrode 16 and the two-dimensional electron gas layer 14.

In contrast, according to the manufacturing method of the exemplary embodiment of this disclosure, it is not required to provided a layer having a wide band gap (a layer having a high Al composition) such as the AlN layer. In other words, for example, even if the Al composition ratio of the barrier layer 13 (a value of x in $Al_xGa_{1-x}N$) is 0.5 or less, since an abrupt interface is formed between the barrier layer 13 and the electron transit layer 12, the above-mentioned problems in leakage current and contact resistance are improved. With considering these points, in the above-mentioned manufacturing method, it is required to set the time period $t_2$ of the growth interrupt process so that TMG remains in the chamber in starting the pre-flow process. Preferably, the time period $t_2$ of the growth interrupt process is set so that the concentration of TMG in starting the pre-flow process is the same as or is lower than the concentration of TMG in the second growth process. Therefore, it is possible to improve the mobility in the two-dimensional electron gas layer 14 and obtain preferable characteristics as a HEMT device, without increasing the leakage current and increasing the resistance of the source electrode or the drain electrode.

Further, if it is to form a spacer layer having a high Al composition ratio or a layer equivalent to the spacer layer, it is preferable to lengthen the time period $t_2$ of the growth interrupt process and to discharge TMG from the chamber. However, for example, in a case of performing the growth interrupt process for five minutes or more so as to form a HEMT device, the characteristic deterioration such as an increase in leakage current or current collapse occurs. It would appear that, when the concentration of TMG in the chamber is to be almost 0 during the growth interrupt process, the surface of the already formed electron transit layer 12 may get rough due to the carrier gas or $NH_3$ flowing in the growth interrupt process. For this reason, the flatness of the surface may be damaged. In the above-mentioned manufacturing method, since the time period $t_2$ of the growth interrupt process is set to 1 minute or less, that characteristic deterioration of the HEMT device is suppressed.

Figure 4:
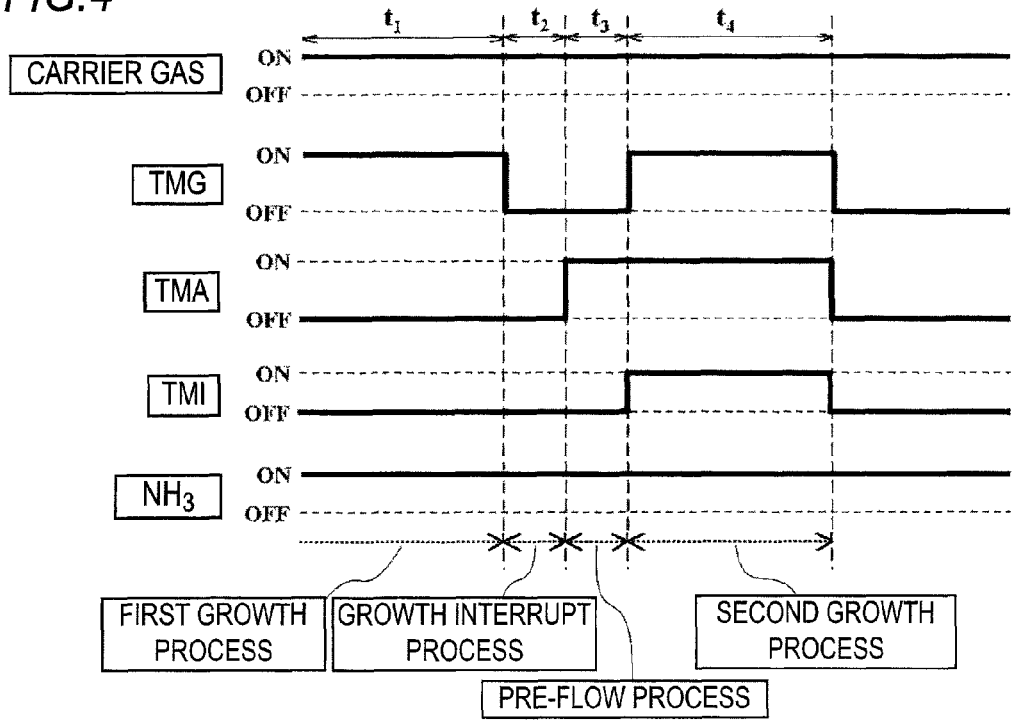

As a modification of the above-mentioned manufacturing method (growth method), a case of making the barrier layer 13 of AlInN ($Al_xIn_yN$ where x+y=1), not AlGaN, will be described. FIG. 4 is a view schematically illustrating a situation of supply (ON) and supply disruption (OFF) of each gas with time in this modified case. In this case, as a source of indium (In) of FIG. 1, trimethylindium (TMI) is used. Therefore, in the second growth process, the TMA and TMI are supplied (ON).

However, in the pre-flow process, TMI is not supplied (OFF), and only TMA is supplied (ON). As described above, this is for the abruptness of the Ga composition and the Al composition. In other words, even when the barrier layer 13 is made of AlInN, if only the nitrogen source gas and the Al source gas (and the carrier gas) are supplied in the pre-flow process, it is possible to improve the abruptness at the hetero interface between the GaN layer and the AlInN layer.

Even when the barrier layer 13 is made of $Al_xGa_{1-x-y}In_yN$ (where x>0, y≧0, and x+y≦1) which is intermediate between AlGaN and AlInN, the same effect is obtained. Even in this case, x≦0.5 is preferable, as described above.

Incidentally, although the barrier layer (second semiconductor layer) is undoped in the above-mentioned example, it is apparent that the above-mentioned manufacturing method can be applied to even a case where the second semiconductor layer is doped with an impurity. In this case, the source gas of the impurity may be supplied (ON) only in the second growth process, and the supply of the source gas of the impurity may be not supplied (OFF) in processes prior to the second growth process.

Further, the flow rate of each source gas is appropriately set according to the composition and thickness of each layer to be grown. It is also possible to set an appropriate standby time during switching to each of the above-mentioned processes for the growth, that is, between the processes.

Furthermore, in the above-mentioned example, the HEMT device has been described. However, it is apparent that the above-mentioned manufacturing method is effective for a semiconductor device uses a heterojunction between a GaN layer and an AlGaN layer (or AlInN layer), such as a diode element or a combined element using that and a diode element which.

What is claimed is:

1. A method of manufacturing a semiconductor device, in which a second semiconductor layer of $Al_xGa_{1-x-y}In_yN$ (wherein x, y, and x+y satisfy x>0, y≧0, and x+y≦1, respectively) on a first semiconductor layer of GaN by heteroepitaxial growth using a MOCVD method, the method comprising the steps of:
    (a) supplying N source gas and Ga source gas to form the first semiconductor layer;
    (b) supplying the N source gas without supplying the Ga source gas and Al source gas, after step (a);
    (c) supplying the N source gas and the Al source gas without supplying the Ga source gas, after step (b); and
    (d) supplying the N source gas, the Ga source gas and the Al source gas to form the second semiconductor layer, after step (c).

2. The method of manufacturing a semiconductor device according to claim 1,
    wherein the Ga source gas remains around the first semiconductor layer in starting step (c), and
    wherein the second semiconductor layer is made of $Al_xGa_{1-x-y}In_yN$ (wherein x, y, and x+y satisfy x>0, y≧0, and x+y<1, respectively).

3. The method of manufacturing a semiconductor device according to claim 2,
    wherein the second semiconductor layer is made of $Al_xGa_{1-x-y}In_yN$ (x, y, and x+y satisfy 0<x≦0.5, y≧0, and x+y<1, respectively).

4. The method of manufacturing a semiconductor device according to claim 1, wherein a time period of step (b) is set to 5 minutes or less.

5. The method of manufacturing a semiconductor device according to claim 1, wherein the Ga source gas is trimethylgallium (TMG), the N source gas is $NH_3$ (ammonia), and the Al source gas is trimethylaluminum (TMA).

6. A semiconductor device manufactured by the method of manufacturing a semiconductor device according to claim 1.

* * * * *